United States Patent
Karlsson et al.

(10) Patent No.: US 9,901,019 B2
(45) Date of Patent: Feb. 20, 2018

(54) TAPE FEEDER AND METHOD FOR MOVING A CARRIER TAPE TOWARDS A PICKING POSITION IN A COMPONENT MOUNTING MACHINE

(71) Applicant: Mycronic AB, Taby (SE)

(72) Inventors: Kristofer Karlsson, Taby (SE); Andreas Larsson, Molndal (SE)

(73) Assignee: Mycronic AB, Taby (SE)

( * ) Notice: Subject to any disclaimer, the term of this patent is extended or adjusted under 35 U.S.C. 154(b) by 0 days.

(21) Appl. No.: 15/217,786

(22) Filed: Jul. 22, 2016

(65) Prior Publication Data

US 2017/0049014 A1 Feb. 16, 2017

Related U.S. Application Data

(63) Continuation of application No. 14/110,429, filed as application No. PCT/EP2012/056228 on Apr. 4, 2012, now Pat. No. 9,642,294.

(Continued)

(51) Int. Cl.
*H05K 13/02* (2006.01)
*H05K 13/04* (2006.01)

(52) U.S. Cl.
CPC ........... *H05K 13/02* (2013.01); *H05K 13/021* (2013.01); *H05K 13/0404* (2013.01);
(Continued)

(58) Field of Classification Search
CPC ............. H05K 13/021; H05K 13/0408; H05K 13/0417
See application file for complete search history.

(56) References Cited

U.S. PATENT DOCUMENTS 4,657,158 A * 4/1987 Faes .................... H05K 13/0417
221/197
4,740,136 A * 4/1988 Asai .................... H01L 21/6838
221/74

(Continued)

FOREIGN PATENT DOCUMENTS

| JP | 2007150145 A | 6/2007 |
|----|--------------|--------|
| WO | 1986000778 A1 | 1/1986 |
| WO | 2000038491 A1 | 6/2000 |

OTHER PUBLICATIONS

International Preliminary Report, PCT Application No. PCT/EP2012/056228, published as WO 2013/037511, May 6, 2013, 15 pages.

(Continued)

*Primary Examiner* — Mark A Osele
(74) *Attorney, Agent, or Firm* — Haynes Beffel & Wolfeld LLP; Ernest J. Beffel, Jr.

(57) ABSTRACT

A tape feeder, including a tape feeder body and a feeder wagon/linear guide, is used to direct component tape in a linear movement towards a component pick position. The feeder wagon comprises a feeder wagon body slidably mounted to the tape feeder body for movement between a first, pickup position and a second, delivery position. The feeder wagon further comprises a feeder head mounted to the feeder wagon body for movement (1) with the feeder wagon body as it moves along the first path, and (2) along a second path transverse to the first path between a first, tape-engaged position and a second, tape-released position. The feeder head comprises a tape-engaging element engageable with component tape.

10 Claims, 10 Drawing Sheets

Related U.S. Application Data

(60) Provisional application No. 61/473,679, filed on Apr. 8, 2011.

(52) U.S. Cl.
    CPC ..... *H05K 13/0408* (2013.01); *H05K 13/0417* (2013.01); *Y10T 156/17* (2015.01)

(56) References Cited

U.S. PATENT DOCUMENTS

| | | | |
|---|---|---|---|
| 6,877,541 B2 | 4/2005 | Ju et al. | |
| 7,228,620 B2 | 6/2007 | Bergstrom | |
| 7,243,828 B2 | 7/2007 | Ricketson | |
| 7,805,831 B2* | 10/2010 | Saho | H05K 13/0417 29/593 |
| 7,997,403 B2* | 8/2011 | Larsson | B65G 25/04 198/763 |
| 8,234,779 B2* | 8/2012 | Larsson | H05K 13/028 29/739 |
| 2004/0200578 A1* | 10/2004 | Ju | H05K 13/0417 156/765 |
| 2005/0006030 A1 | 1/2005 | Bergstrom | |
| 2006/0102681 A1* | 5/2006 | Ricketson | H05K 13/0417 226/128 |

OTHER PUBLICATIONS

International Search Report, PCT Application No. PCT/EP2012/056228, published as WO 2013/037511, Aug. 31, 2012, 3 pages.
U.S. Appl. No. 14/110,429—Office Action dated Mar. 24, 2016, 11 pages.
JP2014503140, Office Action dated May 17, 2016, 6 pages. with machine translation.
JP2014503140, Response to Office Action dated May 17, 2016, 16 pages, with machine translation.
EP12716303.8, Response to Search Report, 36 pages.
PCTEP201256228, Response to Written Opinion dated , 16 pages.
JP2014503140, Office Action dated Apr. 25, 2017,4 pages. with machine translation.

* cited by examiner

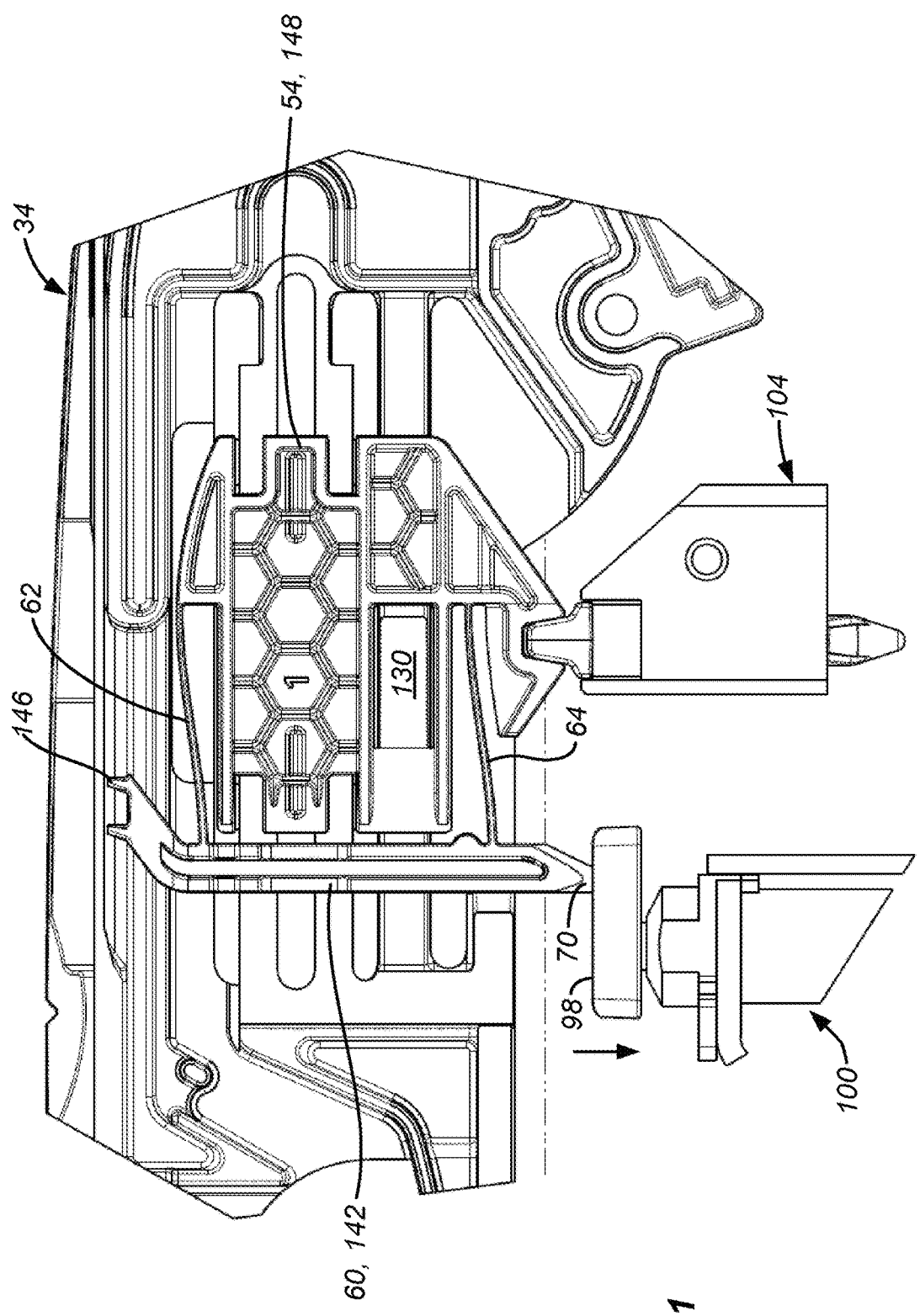

TAPE FEEDER AND METHOD FOR MOVING A CARRIER TAPE TOWARDS A PICKING POSITION IN A COMPONENT MOUNTING MACHINE

RELATED APPLICATIONS

This application is a continuation of U.S. patent application Ser. No. 14/110,429 entitled, "Tape Feeder and Method for Moving a Carrier Tape Towards a Picking Position in a Component Mounting Machine", filed on 12 Sep. 2014, now U.S. Pat. No. 9,642,294, issued 2 May 2017 which is a National Stage Application of PCT/EP2012/056228, entitled "Tape Feeder and Method for Moving a Carrier Tape Towards a Picking Position in a Component Mounting Machine", filed on 4 Apr. 2012 which is related to and claims the benefit of U.S. Prov. App. No. 61/473,679, entitled "Method and a Force Transmitting Arrangement for Engaging and Moving a Carrier Tape Towards a Picking Position in a Component Mounting Machine," filed 8 Apr. 2011.

BACKGROUND

The technology disclosed generally relates to the field of manufacture and assembly of circuit boards. More specifically it relates to structure for delivering component tape to a component pickup position at which a component mounting machine removes components from the carrier tape for placement on a circuit board.

Generally, within the field of manufacture and assembly of circuit boards, electronic components are fed to a component mounting machine for mechanically and/or electrically mounting the components onto a circuit board. These surface mounted components are often delivered spaced apart along the length of a component tape, which consists of a lower carrier tape provided with compartments, one for each component, and an upper cover, or cover tape or protective tape.

After positioning the electronic components in the corresponding compartments, the cover tape is attached to the carrier tape, and the component tape is wound on a component reel. The attachment of the cover tape to the carrier tape can, for instance, be performed by providing either the cover tape or the carrier tape with adhesive areas, or by fusing the cover tape to the carrier tape. Then, the component reel is transferred to a component mounting machine, which feeds a component to a certain predetermined picking position where it can be picked, or collected, by a pick-up head. WO 1986/00778 shows a cassette magazine for a component mounting machine using the above described method.

According to a method conventionally used within the art, the loading of a component tape in a component mounting machine involves the following steps. Placing the component tape reel into the tape holder of a component mounting machine, or into a tape magazine of a component mounting machine; introducing the free end of the component tape into a feeding mechanism, provided in the machine or in the magazine, such that feeding pins engage corresponding holes provided in the component tape; separating, e.g. by hand, the end of the cover tape from the end of the carrier tape for a distance sufficient for the cover tape to be engaged with a cover tape handling means; and lowering a locking mechanism over the carrier tape for holding the carrier tape against the feeding mechanism.

Prior to the picking of the components, each component has to be exposed so as to make it available for picking. Conventionally, this is achieved by removing the cover tape from the carrier tape. The cover tape is then fed away by a separate cover tape handling means in order for the cover tape not to disturb the picking of components. Generally, the cover tape handling means comprises a winding hub on which the cover tape is wound. Additionally, when unloading the component tape from the component mounting machine, or the tape magazine, the winding hub has to be cleared of the cover tape.

A considerable length of the end of the cover tape has to be separated from the end of the carrier tape in order to bring the cover tape end to a cover tape handling means. Thus, the first decimeters of a new carrier tape are typically not provided with components. Otherwise, numerous components would be wasted during loading. However, when reloading a tape reel that already has been partly used, the tape is provided with components throughout, and consequently a large number of components may be wasted.

Prior art solutions describe a component tape comprising a carrier tape provided with compartments filled with components and a cover tape introduced into a feeding mechanism. Pins of feeder heads, mounted in the tape magazine, engage corresponding holes provided in the carrier tape. The end of the cover tape is removed from the carrier tape and wound onto a winding hub, which is provided with a separate feeding mechanism. The cover tape is brought past a first plate provided with a stripping edge, and the cover tape may be stretched by a separate reel applying pressure on the cover tape. A second plate may be provided after the first plate for preventing small components that can be electrostatically adhered to the cover tape from sticking to and following the removed portion of the cover tape when said portion is fed away. The second plate extends to a position where the components are picked by a pick-up head.

U.S. Pat. No. 7,220,620 discloses a system where the tape guide is provided with means for exposing a component to be picked at a picking position. This exposure means comprises separating means for separating and lifting a lateral portion of the cover from the carrier tape, leaving the remaining portion of the cover at least partially attached to the carrier tape, and for bringing the lifted portion of the cover aside such that the component to be picked can be exposed.

The use of such separating means in U.S. Pat. No. 7,220,620 eliminates the need for means handling the cover tape after removal from the carrier tape since the cover remains attached to the carrier tape.

The previously discussed tape feeders and tape guides may not be suitable for use when the component is contained within a deep compartment in the carrier tape. Specifically, the tape feeders in combination with tape guides are typically not adapted to allow a picker to remove the component from such deep compartments. Therefore there exists a need for structure that allows for the picking of components within deep compartments in carrier tape. Furthermore, the previously discussed tape guides are not adapted for use with various tape feeders that accommodate wide ranges of tapes with varying widths. Therefore, in order to improve manufacturing efficiency and operational flexibility, there exists a need for a tape guide that is capable of operating with a wide range of tape feeders such that a different tape guide does not have to be used with each specific tape feeder in order to accommodate the different widths of tape that each tape feeder utilizes.

The magazine slots of state of the art component tape magazines are typically not capable of operating with different types of tape feeders carrying component tapes with different widths, and/or tape feeders that are capable of operating with a wide ranges of tapes having varying width, since each tape feeder position or slot is only capable of operating with a specific type of tape feeder suitable only for carrying tapes with a certain limited width range. Therefore, in order to further improve manufacturing efficiency and operational flexibility, there exists a need for a component tape magazine having a plurality of slots or positions for accommodating tape feeders, which are each configured to accommodate and operate with different types of tape feeders and/or tape feeders which are configured to accommodate component tapes with a wide range of widths.

SUMMARY

The technology disclosed introduces a linear guide, a feeder wagon in one example, into a tape feeder that allows for movement along the y and z axes, within the tape feeder. In allowing for a linear movement of the linear guide along the y axis and the movement of a tape-engaging element of the linear guide in the z axis direction, the tape feeder allows for the picker to pick components from the carrier tape that are held within deep compartments of the carrier tape. The linear guide can be used with various types of tape feeders that are used with varying widths of component tape. Therefore the tape feeder can be used to guide tapes of varying widths. In order to achieve a cost efficient solution, the tape feeder can include components for performing multiple or all functions associated with the loading and picking of components from carrier tape including but not limited to linear bearings, feeder head, spring and magazine interfaces. The linear guide can also be a separate force transmitting unit in form of e.g. a one piece molded plastic part that is configured to be releasably mounted or coupled to the tape feeder and is easy to replace if it breaks or wears out.

One important aspect of the invention is that the force transmitting linear guide comprises a tape-engaging element in form of a feeder head that is adapted to be engageable with component tapes of various widths with high accuracy, even components that are held within deep compartments of the carrier tape. The feeder head is further adapted to be engageable with the component tapes to provide the linear movement of the component tapes from a first, tape engaging position to a second, tape released position. The linear guide may be adapted to use a driving force generated by the support structure to which the tape feeder is coupled or mounted, such as a component tape magazine and/or a component mounting machine, e.g. when the tape feeder lacks a force generating mechanisms. The driving force may then be generated by the support structure to provide a movement of the force transmitting linear guide which is used for pulling the component tape in a linear movement from the first, tape engaging position to the second, tape released position. Thus, examples of the present invention (1) permit the feeding pins of the feeder wagon to reach the feeding holes in many types of component tape, (2) provide a force transmitting unit which may be used with all tape widths and tapes with deep pockets, and (3) is adapted to engage with different types of component tapes with high accuracy to enable feeding of components that are held within deep compartments of a carrier tape and feeding of small components.

The linear guide and tape feeder of the invention is used with a component mounting machine, or in a component tape magazine arranged to be loaded into the component mounting machine, to direct component tape in a linear movement towards a component pick position. The component tape is of the type including a carrier tape, with compartments containing circuit board components, and a cover tape. The tape feeder includes a tape feeder body and a feeder wagon. The tape feeder body comprises a first side and tape guide elements defining a tape guide path, the first side having an inner surface. The feeder wagon comprises a feeder wagon body slidably mounted to the inner surface of the first side for movement along a first path parallel to the tape guide path between a first, pickup position and a second, delivery position. The feeder wagon further comprises a feeder head mounted to the feeder wagon body for movement (1) with the feeder wagon body as it moves along the first path, and (2) along a second path transverse to the first path between a first, tape-engaged position and a second, tape-released position. The feeder wagon comprises at least one driven interface through which the feeder wagon can be moved along the first path and the feeder head can be moved along the second path. The feeder head comprises a tape-engaging element engageable with component tape at the tape guide path when the feeder head is in the tape-engaged position.

Some examples of the tape feeder may include one or more the following. The feeder head may have an upper end, with the tape-engaging element at the upper end, and a lower end, the lower end of the feeder head and the feeder wagon body comprising engagement surfaces which engage one another when the feeder head is in the tape-engaged position. The feeder head and the feeder wagon body may comprise anti-bounce engagement surfaces which engage one another when the feeder head is in the tape-released position.

An example of a tape feeder and drive assembly comprises a tape feeder, a support structure, and means, carried by the support structure, for engaging the at least one driven interface and moving the feeder wagon body along the first path and the feeder head along the second path.

Another example of a tape feeder and drive assembly comprises a tape feeder, with at least one driven interface comprising a first driven interface and a second driven interface, and a support structure. A first driving element is carried by the support structure and engages the first driven interface to move the feeder wagon along the first path. A second driving element is carried by the support structure and engages the second driven interface to move the feeder head along the second path.

An example of a linear guide is used as a component of a tape feeder, the tape feeder of the type used to direct component tape along a tape guide path towards a component pick position of a component mounting machine. The component tape is of the type including a carrier tape, with compartments containing circuit board components, and a cover tape, the linear guide comprises a feeder wagon body and a feeder head. The feeder wagon body is slidably mountable to a tape feeder for movement along a first path parallel to the tape guide path for movement between a first, pickup position and a second, delivery position. The feeder head is mounted to the feeder wagon body for movement (1) with the feeder wagon body as it moves along the first path, and (2) along a second path transverse to the first path between a first, tape-engaged position and a second, tape-released position. The linear guide also comprises at least one driven interface through which the feeder wagon can be moved along the first path and the feeder head can be moved along the second path. The feeder head also comprises a tape-engaging element engageable with component tape at the tape guide path when the feeder head is in the tape-engaged position.

A method for directing component tape to a component pick position is used with a component mounting machine of the type including an electronic component pickup head at a component pick position. The component tape is of the type including a carrier tape with compartments containing circuit board components. A length of component tape is positioned along a tape guide path of a tape feeder body of a tape feeder, the tape feeder further comprising a feeder wagon, the feeder wagon comprising a feeder wagon body and a feeder head. The feeder head is moved along a feeder head path transverse to the tape guide path from a tape-released position to a tape-engaged position at which the feeder head drivingly engages the component tape. The feeder wagon body, and the feeder head therewith, is moved along a linear path generally parallel to the tape guide path from a first feeder wagon position to a second feeder wagon position. This movement causes the feeder head, engaging the component tape, to move a compartment of the carrier tape to the component pick position. The feeder head is moved along a reverse feeder head path from the tape-engaged position to the tape-released position thereby disengaging the feeder head from the carrier tape. The feeder wagon body, and the feeder head therewith, is moved from the second feeder wagon position to the first feeder wagon position. In some examples of the method each of the moving steps is completed before another moving step begins.

BRIEF DESCRIPTION OF THE DRAWINGS

FIG. 11 shows the structure of FIG. 10 after the z-axis driving unit moved downwardly so that the feeder head also moves downwardly to the second, lower, tape released position of FIG. 8, and with the y-axis driving unit maintaining its position of FIG. 10. This is followed by the movement of the feeder wagon and the y-axis driving unit back to their positions of FIG. 8 so that the new cycle can be started.

DETAILED DESCRIPTION

Figure 1:
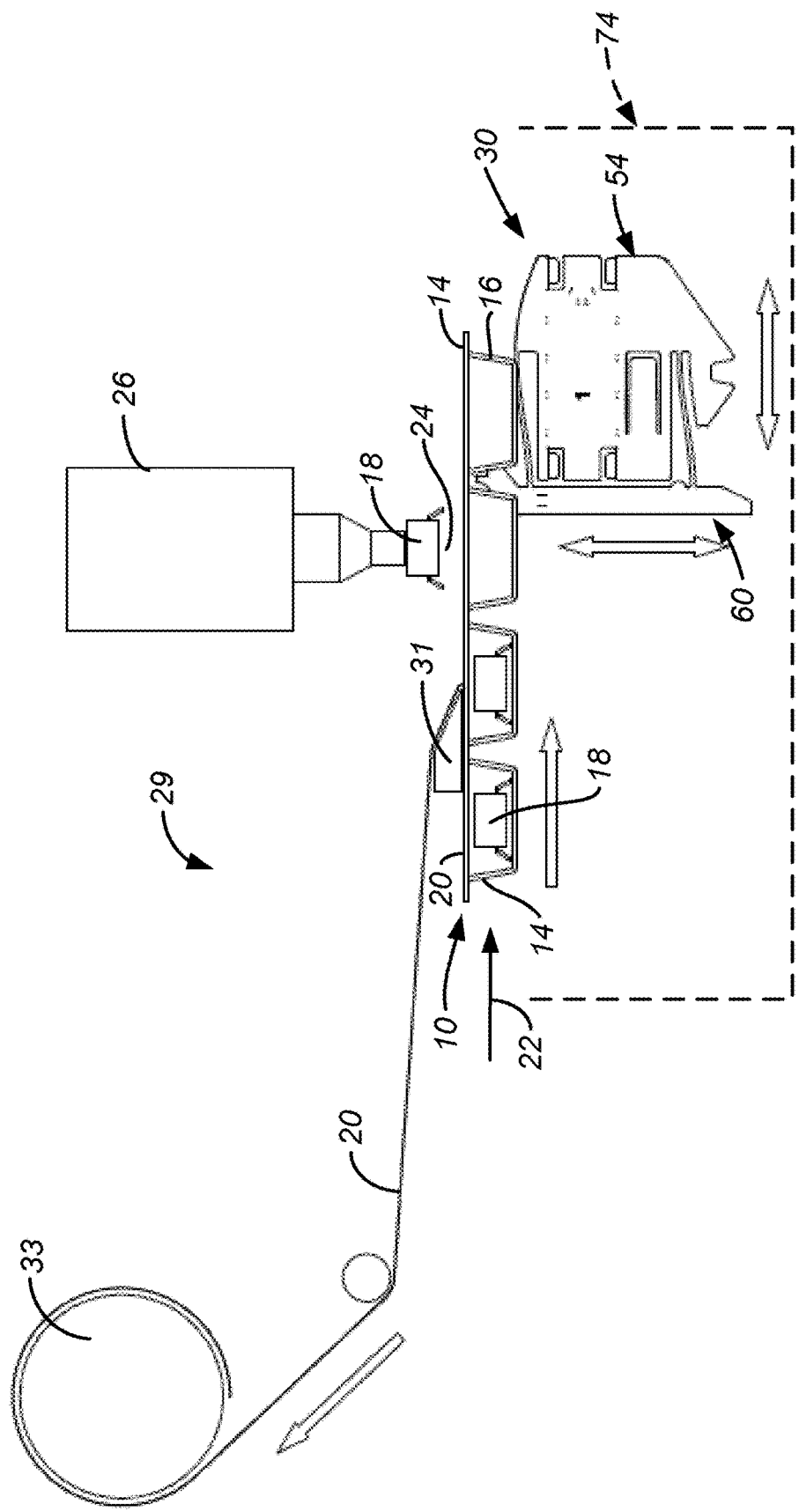
FIG. 1 is a simplified schematic side view showing a component tape to be directed along a tape guide path to a component pickup position beneath the pickup head of a component mounting machine by the feeder wagon of the tape feeder of FIG. 2.

Prior art feeder heads, mounted in the magazines, are typically not able to reach the component tape in feeders for tapes with deep pockets. To get a robust function, the technology disclosed introduces a linear guide, referred to as a feeder wagon or force transmitting arrangement, for the Y and Z movement where the linear guide is mounted to one side, such as the left side, of the tape feeder body. In order to achieve a cost efficient solution, in some examples the feeder wagon provides multiple or all functions, e.g. linear bearing, feeder head, spring and magazine interface etc, in one molded plastic part which is easy to replace if it breaks or wears out. Thus, examples of the present invention permit the feeding pins of the feeder wagon to reach the feeding holes in many types of component tape, provides a force transmitting mechanism which may be used with all tape widths and tapes with deep pockets, and which is adapted to engage with different types of component tapes with high accuracy to enable feeding of components that are held within deep compartments of a carrier tape and feeding of small components.

The present invention may also provide improved manufacturing efficiency and operational flexibility by allowing for the introduction of a new type of flexible component tape magazines in which a plurality of tape feeders may be positioned randomly, or alternatively, which is configured with a plurality of discrete tape feeder positions or magazine slots for accommodating tape feeders, where at least one of the magazine slots is suitable for accommodating and operating with various types of tape feeders and/or tape feeders which are configured to accommodate component tapes with a wide range of tape widths.

The technology disclosed may be useful where a plurality of functions are achieved by the introduction of one part, the feeder wagon, which enables a short tolerance chain and a minimum of play. The feeder wagon is easy to replace if it breaks or if another design is needed for a special tape. The feeder wagon is mounted to one side of the tape feeder body which makes it easy to produce tape feeders for different tape sizes and to have different tape feeder sizes in the same magazine or the support structure. The interface between the tape feeder and the magazine or other support structure allows the position of the feeder wagon to be automatically corrected independent where the feeder wagon is during its stroke or cycle.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

The force transmitting linear guide of the invention comprises a tape-engaging element in form of a feeder head, preferably comprising feeding pins, and that is adapted to be engageable with component tapes of various widths with high accuracy, even components that are held within deep compartments of the carrier tape. The feeder head is further adapted to be movable along the tape guide by the impact or imposition of an externally-generated driving force to pull the component tapes in a linear movement from a first, tape engaging position to a second, tape released position. The force transmitting linear guide may then be an intermediate member adapted to transmit the driving force generated by at least one support structure to which the tape feeder is coupled or mounted, such as a component tape magazine and/or a component mounting machine, e.g. when the tape feeder lacks a force generating mechanisms such as an electrically-driven motor. The driving force is instead generated by the at least one support structure in order to achieve the linear movement of the force transmitting linear guide, which is then a passive element that lacks a force generating mechanism such as e.g. an electrically-driven motor. Thus, the force transmitting linear guide is adapted to be engageable with a component tape and to transmit a force generated by at least one of the component tape magazine and the component mounting machine to pull the component tape in a linear movement from the first, tape engaging position to the second, tape released position.

FIG. 1 is a simplified schematic side view of an example of structure for delivering component tape 10 to a component pickup position 24. Component tape 10 includes carrier tape 14 which forms a series of compartments 16 containing electrical components 18. Component tape 10 also includes a cover tape 20 removably secured to carrier tape 14. Component tape 10 moves along the tape guide path 22 and delivers electrical components 18 to a component pickup position 24 at a component mounting machine 26. Machine 26 removes components 18 from the compartments 16 of carrier tape 14, typically for placement on a circuit board, not shown. Component tape 10 is shown being directed along tape guide path 22 to component pickup position 24 beneath the pickup head 28 of component mounting machine 26 by the feeder wagon 30 of the tape feeder 32 of FIG. 2. Cover tape 20 is removed by a cover tape separator 29 including a cover tape separator blade 31 and a cover tape recovery reel 33. In this example cover tape separator 29 is generally conventional and is therefore not described in detail.

Figure 2:
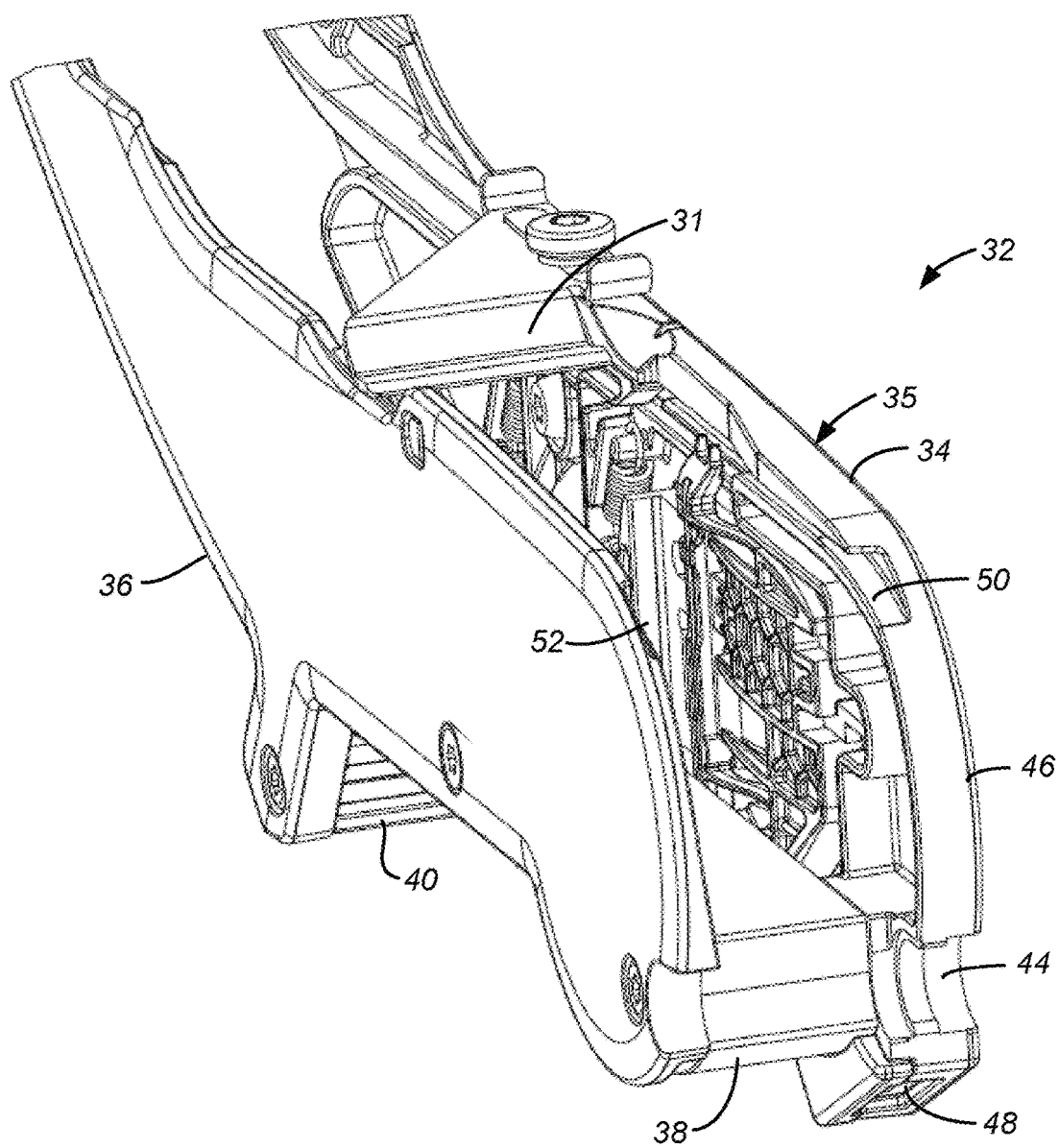
FIG. 2 is an enlarged perspective view of a tape feeder made according to the invention used with the structure of FIG. 1.
Figure 4:
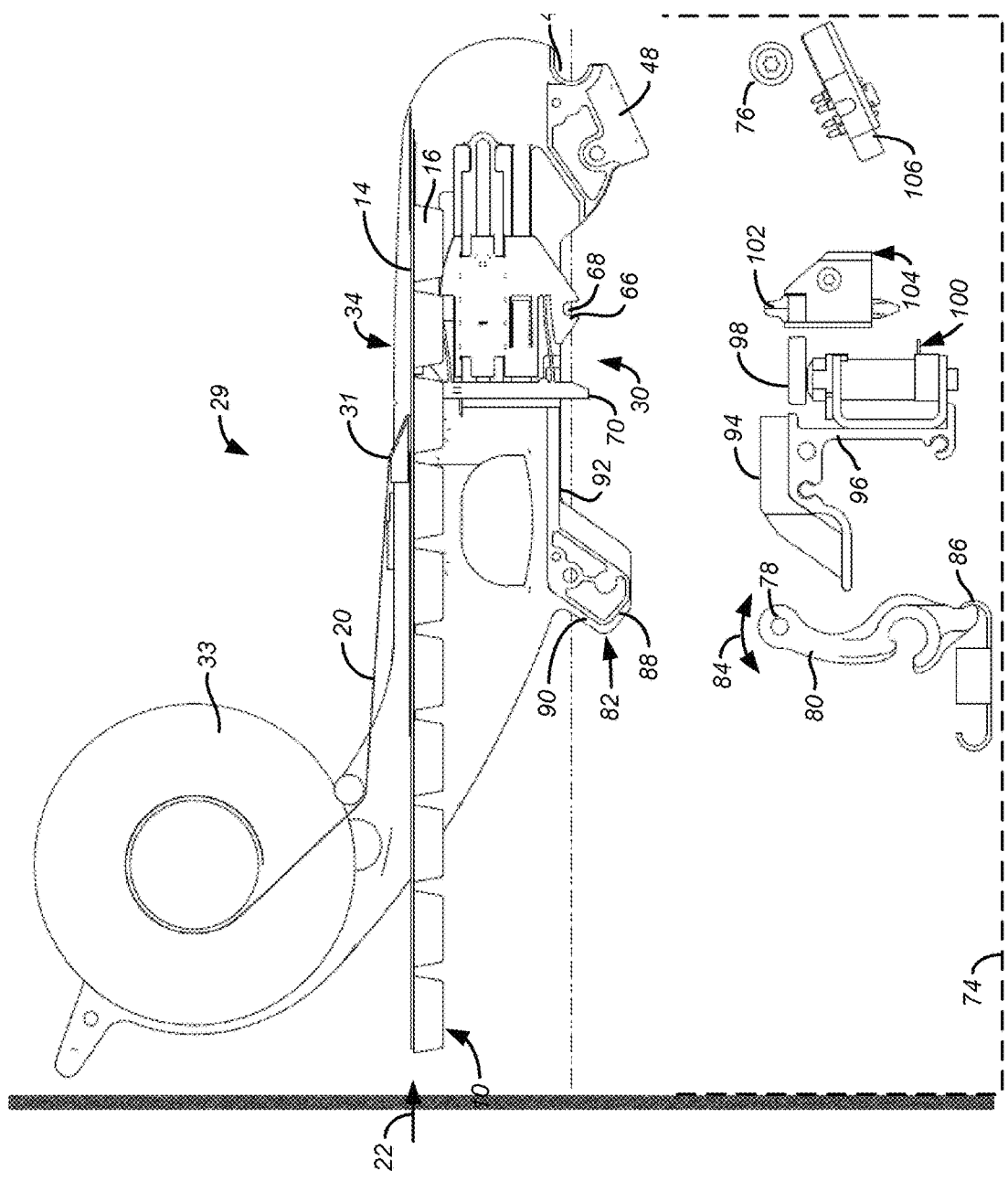
FIG. 4 is an enlarged, somewhat simplified side view showing the tape feeder of FIG. 2, with the right side of the tape feeder body removed to show internal components, being lowered to be supported by a support structure, the support structure shown schematically as dashed lines. Also shown are a number of latching and drive components carried by the support structure.
Figure 5:
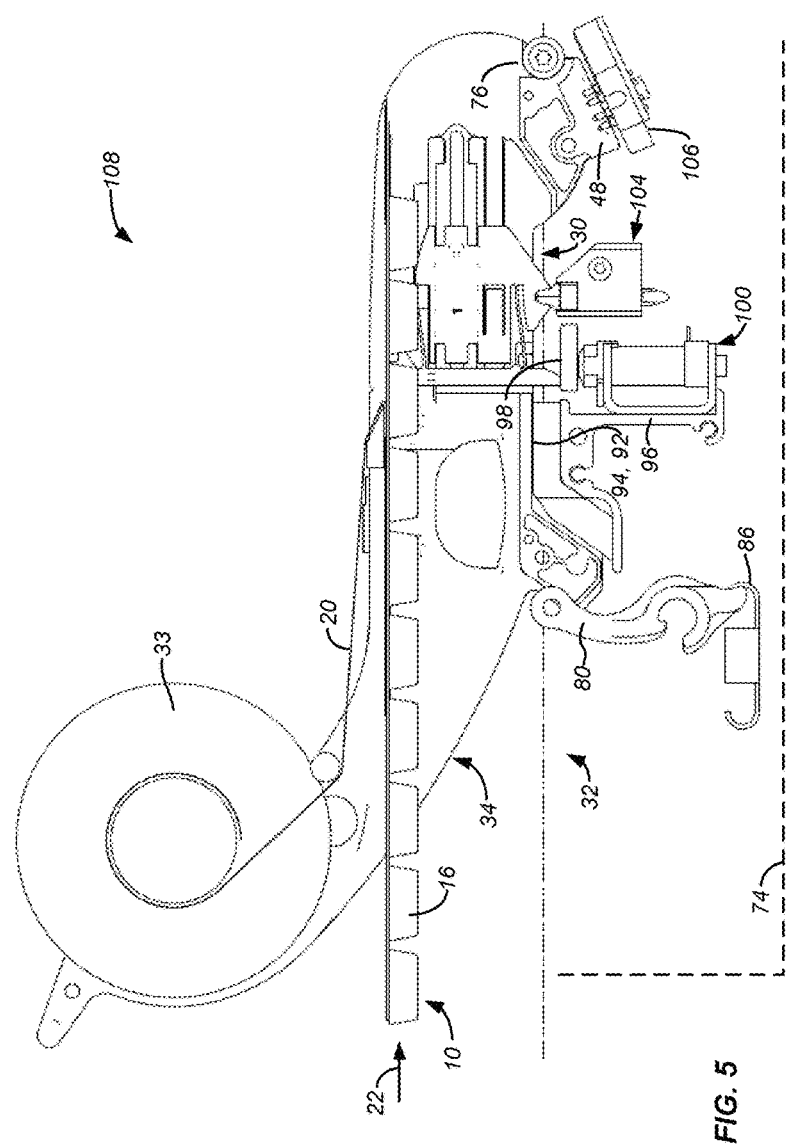
FIG. 5 shows the structure of FIG. 4 after the tape feeder has been mounted to the support structure to create a tape feeder and drive assembly.

FIG. 2 is an enlarged perspective view of a portion of tape feeder 32, tape feeder 32 including broadly a tape feeder body 35. Body 35 includes a first, left side 34, a second, right side 36 connected to one another by spacers 38, 40. Cover tape recovery reel 33 is mounted between left side 34 and right side 36 of tape feeder body 35 as shown in FIGS. 4 and 5. The size of spacers 38, 40 is determined by the width of carrier tape 14. In this example cover tape separator blade 31 is mounted to left side 34 of body 35. In other examples different techniques for removing and dealing with removed cover tape 20 can be used. For example, cover tape separator 29 may be designed to be completely separate from tape feeder 32. Body 35 also includes a semicircular mounting groove 44 formed at the forward end 46 of body 35, the function of which will be discussed below. Left side 34 of body 35 also includes a tape feeder/support structure interface socket 48 used to provide positional information regarding feeder wagon 30 to a control system, not shown. Positional information regarding the position of an electrical component 18 in the X direction, that is perpendicular to the plane of FIG. 1, may also be provided. Left side 34 defines a first, left tape guide grooves 50 while right side 36 defines a second, right tape guide groove 52 to direct carrier tape 14 along tape guide path 22.

Figure 3:
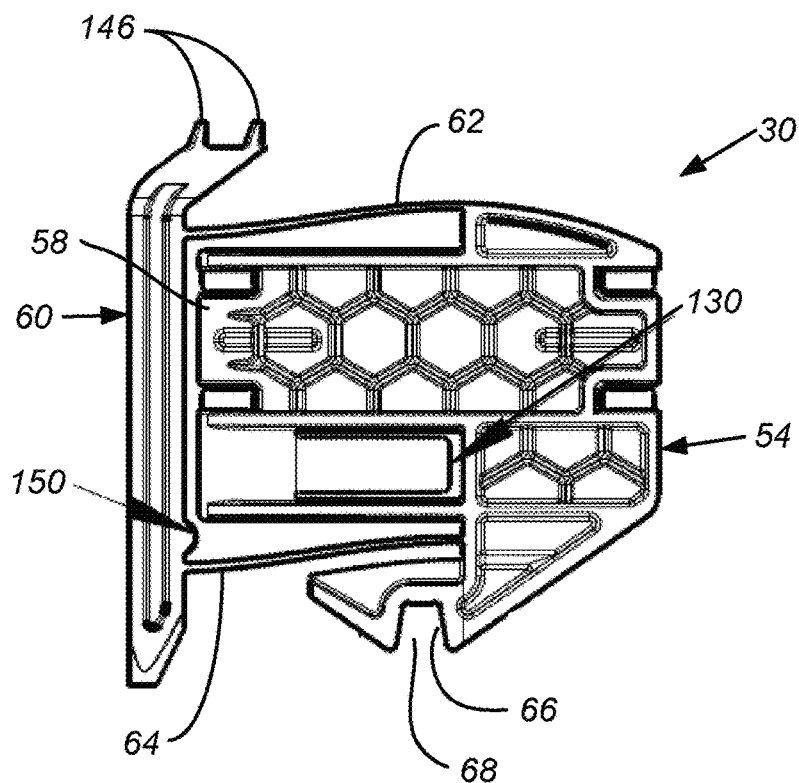
FIG. 3 is a side view of the feeder wagon of the tape feeder of FIG. 2.

FIG. 3 is a side view of the feeder wagon 30 of tape feeder 32. Feeder wagon 30 includes a feeder wagon body 54 having a front end 56 and a back end 58. Feeder wagon 30 also includes a generally vertically oriented feeder head 60 mounted to body 54 by upper and lower, slightly S-shaped springs 62 and 64. The slightly S-shape of springs 62 and 64 is shown in FIG. 3 with the springs in a relaxed state. Feeder wagon body 54 also includes a first driven interface 66 defining a tapered, Y-drive coupler recess 68. Feeder head 60 has a second driven interface 70 at the lower end of the feeder head.

FIG. 4 is an enlarged, somewhat simplified side view showing the tape feeder 32 of FIG. 2 but with the right side 36 of the tape feeder body 35 removed to show internal components. Also shown with left side 34 are feeder wagon 30 and component tape 10, the component tape extending along tape guide path 22. Feeder wagon 30 is shown being lowered into, so to be supported by, a support structure 74, the support structure shown schematically as dashed lines. Support structure 74 may be, for example, the component mounting machine 26 or a tape magazine arranged to be loaded into a component mounting machine.

A number of latching and drive components are carried by support structure 74. A front mounting bar 76 is carried by support structure 74 and is sized to engage within mounting groove 44 by tilting the forward end 46 of tape feeder body 35 downwardly and seating mounting bar 76 into mounting groove 44. The back end of body 35 is then pivoted downwardly until the upper end 78 of latching arm 80 engages a back latching member 82 of left side 34 as upper end 78 moves along a curved path 84. The lower end of latching arm 80 is mounted to support structure 74 by a spring support 86 which permits this movement of latching arm 80. Upper end 78 engages first and second inclined surfaces 88, 90 as left side 34 of body 35 moves into its lower and locked position.

The downward pivotal movement of left side 34, and thus the downward pivotal movement of tape feeder body 35, is halted when a surface 92 of left side 34 engages a fixed surface 94 of a vertical stop member 96. Vertical stop member 96 is mounted to support structure 74 at a fixed position. This engagement is shown in FIG. 5 to form a tape feeder and drive assembly 108. At this point second driven interface 70 of feeder head 60 engages a drive surface 98 of a solenoid type vertical, Z-axis drive unit 100, drive unit 100 being mounted to vertical stop member 96. In addition, a tapered coupling head 102 of a horizontal, Y-axis drive unit 104 passes into Y-drive coupler recess 68 to engage first driven interface 66. The tapered engaging surfaces of tapered coupling head 102 and first driven interface 66 eliminate any play between the surfaces. At this position of FIG. 5, an interface plug 106 engages interface socket 48. In addition to positional information, information relating to the identification of tape feeder 32 may also be provided through the interface socket 48/plug 106.

Figure 6:
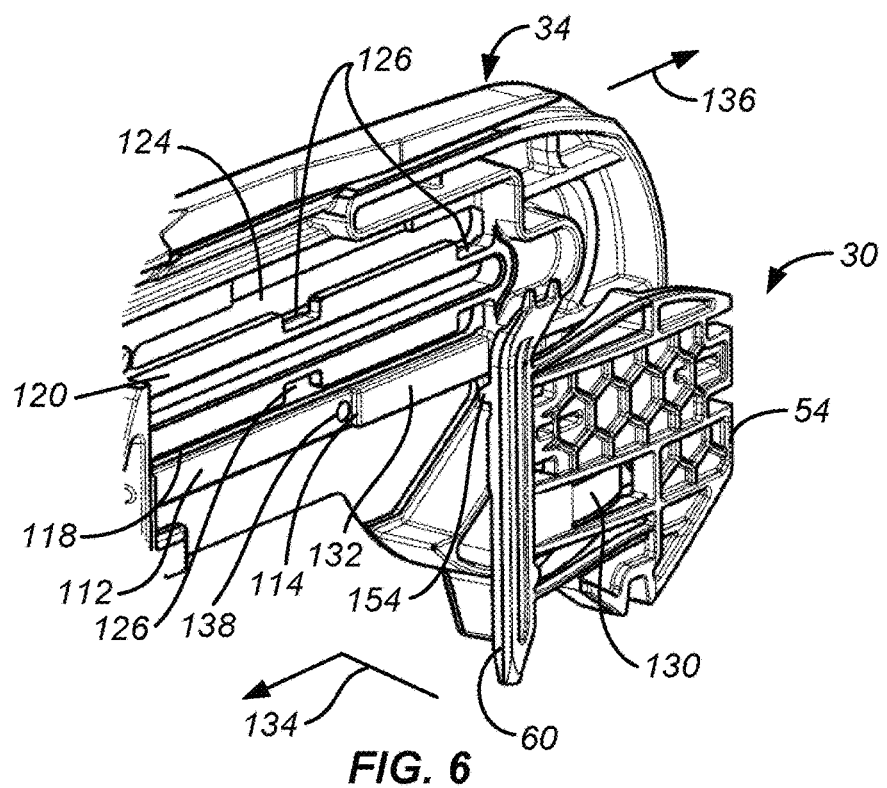
FIG. 6 is exploded isometric view showing the inside surface of a portion of the left side of the tape feeder body and the feeder wagon prior to being mounted to the left side of the tape feeder body, the direction of movement for mounting the feeder wagon suggested by a right angled arrow.
Figure 7:
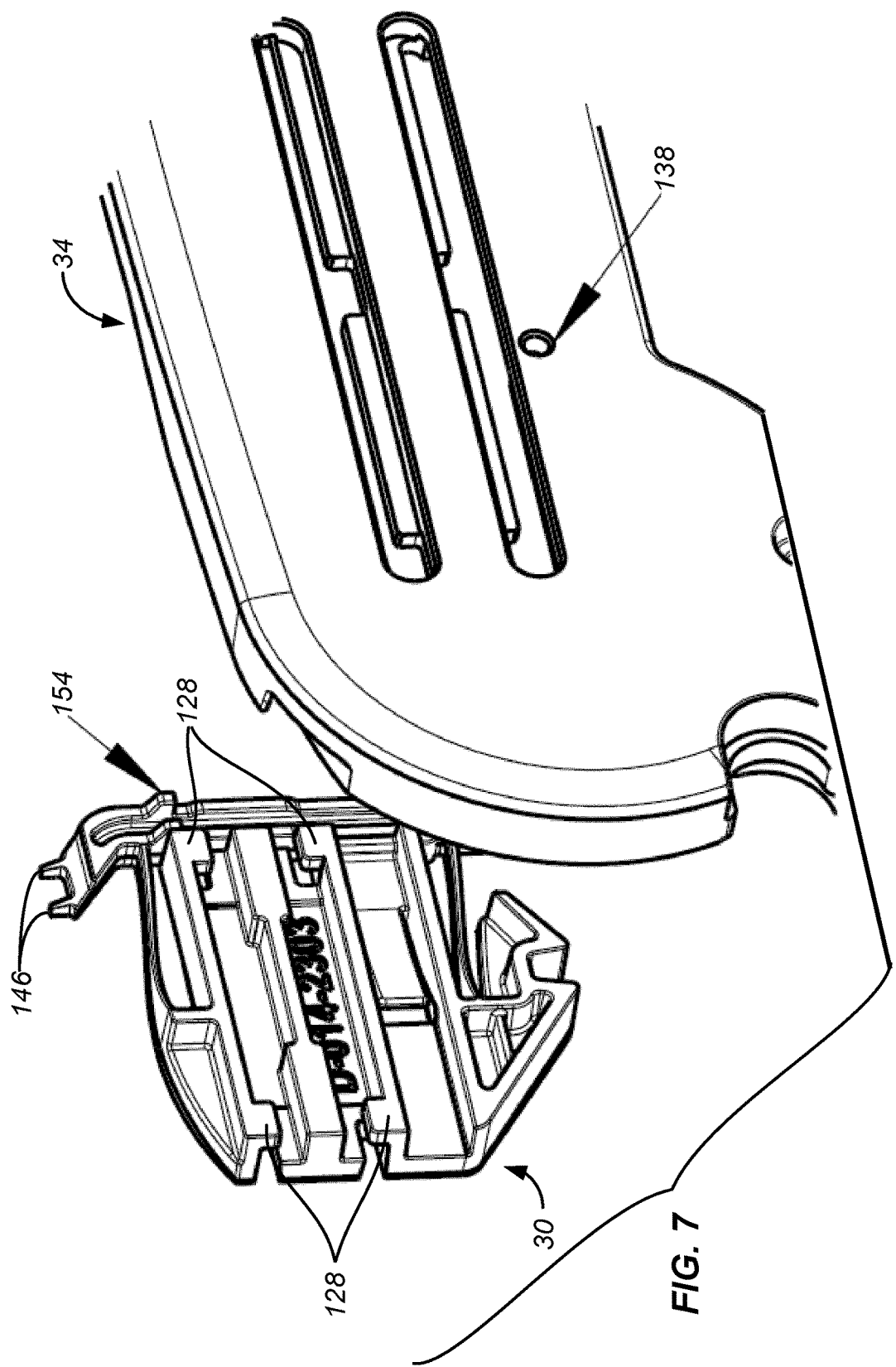
FIG. 7 is an opposite view of the structure of FIG. 6.

FIG. 6 is an exploded isometric view showing the inside surface 110 of a portion of the left side 34 of the tape feeder body 35 and the feeder wagon 30 prior to being mounted to the left side of the tape feeder body. Inside surface 110 includes a groove 112 having a stop surface 114 at one end. Inner surface 110 also has upper and lower grooves 116, 118 defined between upwardly and downwardly extending rails 120, 122 and the wall 124 of left side 34. Notches 126 are formed at the aligned positions in rails 120, 122. Notches 126 are positioned for alignment with correspondingly positioned tabs 128 of feeder wagon 30. Feeder wagon 30 also includes a spring finger 130 which presses against a raised surface 132 just forward of stop surface 114 when feeder wagon 30 is moved against inside surface 110 of the left side 34 as indicated by the first portion of right angled arrow 134. Doing so causes spring finger 130 to be deflected as it engages raised surface 132 permitting tabs 128 to pass through notches 126. With tabs 128 within upper and lower grooves 116, 118, feeder wagon 30 is moved rearward along the second leg of right angled arrow 134 causing spring finger 130 enter groove 112 and tabs 128 to be captured within upper and lower grooves 116, 118. The engagement of spring finger 130 with stop surface 114 limits the forward movement of feeder wagon 30 in the direction of forward arrow 136. To permit feeder wagon 30 to be removed from left side 34, left side 34 has an access opening 138 passing into groove 112 adjacent to stop surface 114. Insertion of an appropriate tool through access opening 138, see FIG. 7, causes spring finger 130 to be deflected inwardly to permit removal of feeder wagon 30 are sliding the feeder wagon in a forward direction.

The actuation and operation of feeder wagon 30 will now be discussed with reference to FIGS. 8-11.

Figure 8:
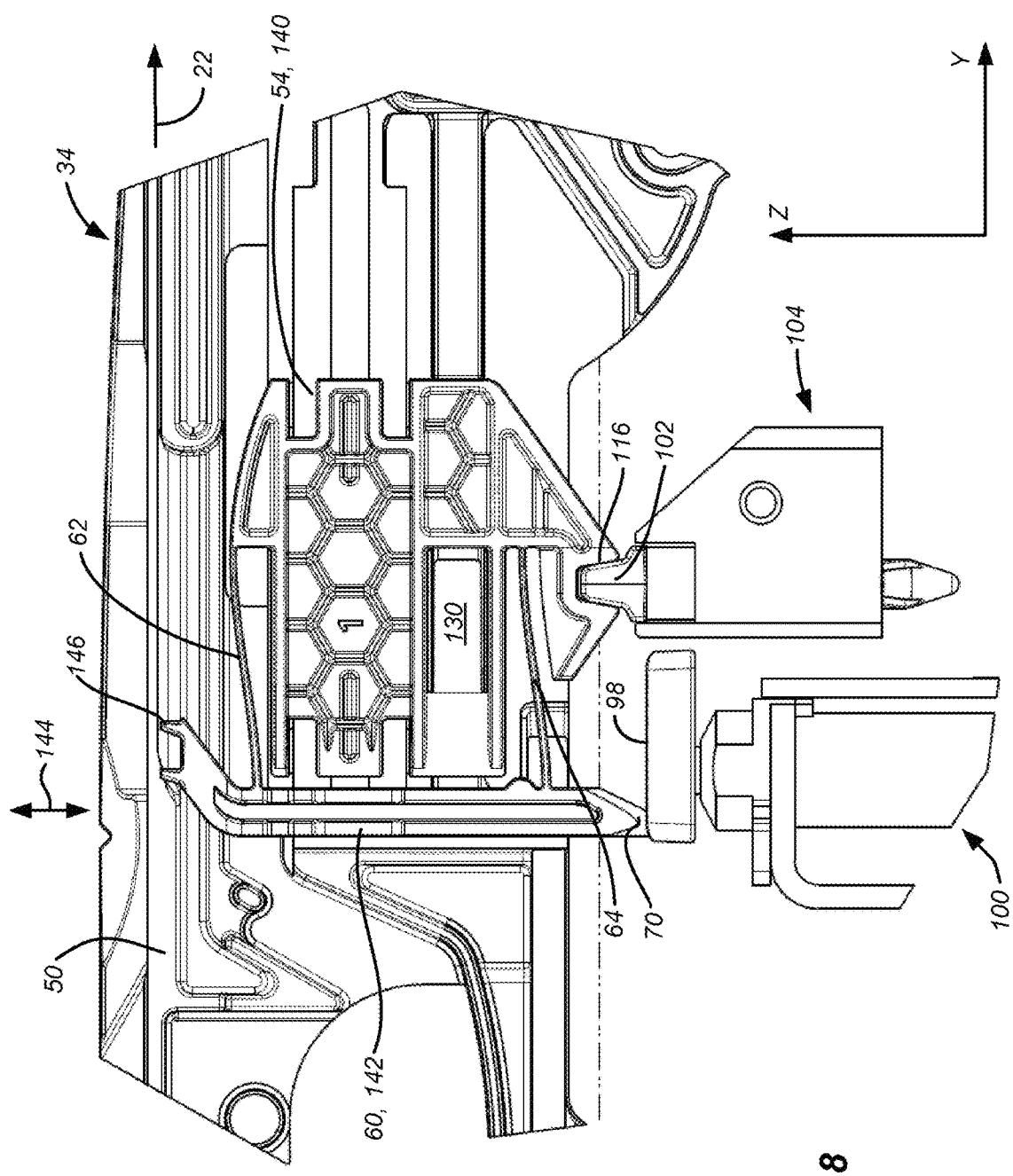
FIG. 8 is an enlarged view of a portion of the structure of FIG. 4 showing the horizontal, y-axis driving unit engaging the feeder wagon body with the feeder wagon body at a first, left most, pickup position, and the vertical, z-axis driving unit engaging the bottom of the feeder head with the feeder head at a second, lowered, tape released position.

FIG. 8 is an enlarged view of a portion of the structure of FIG. 4 showing the generally horizontal, Y-axis driving unit 104 engaging the feeder wagon body 54 through the interengagement of tapered coupling head 102 with first driven interface 66. FIG. 8 shows feeder wagon body 54 at a first, left most, pickup position 140. Feeder head 60 is shown in its second, lowered, tape released position 142 with the second driven interface 70 of feeder head 60 biased against driving surface 98 of z-axis driving unit 100 under the influence of springs 62, 64.

Figure 9:
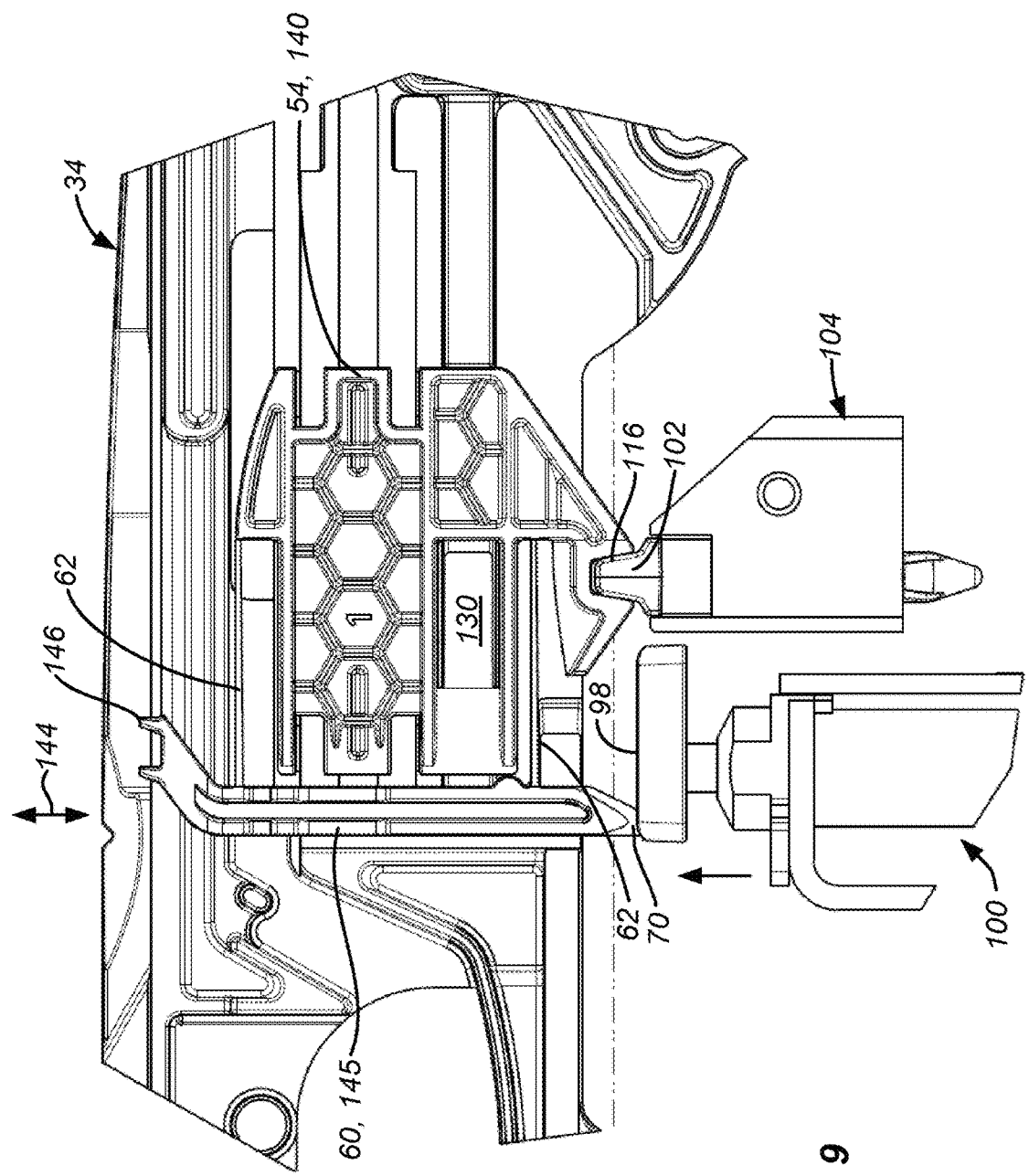
FIG. 9 shows the structure of FIG. 8 with the z-axis driving unit moved upwardly to move the feeder head on a generally vertical second path to a first, tape-engaged position while the y-axis driving unit remains in the first, pickup position.

FIG. 9 shows the structure of FIG. 8 with the driving surface 98 of z-axis driving unit 100 moved upwardly to move the feeder head 60 the along a generally vertical second path 144 to a first, tape-engaged position 145. At tape-engaged position 145 a pair of feeding pins 146 at the upper end of feeder head 60 engage holes, not shown, in compartment tape 10. Upper and lower springs 62, 64 move from a slightly S-shaped configuration in FIG. 8 to a flattened, generally straight configuration in FIG. 9 so that the force exerted by spring 62, 64 on feeder head 60 is generally constant. The flattened, generally straight configuration for spring 62, 64 also helps to ensure that the horizontal movement of feeder head 60 matches the horizontal movement of feeder wagon body 54 as feeder head 60 is pulled parallel to tape guide path 22 because the springs will effectively not deflect during such movement. This generally vertical movement of feeder head 60 occurs while y-axis driving unit 104 remains in its pickup position 140 of FIG. 8.

Figure 10:
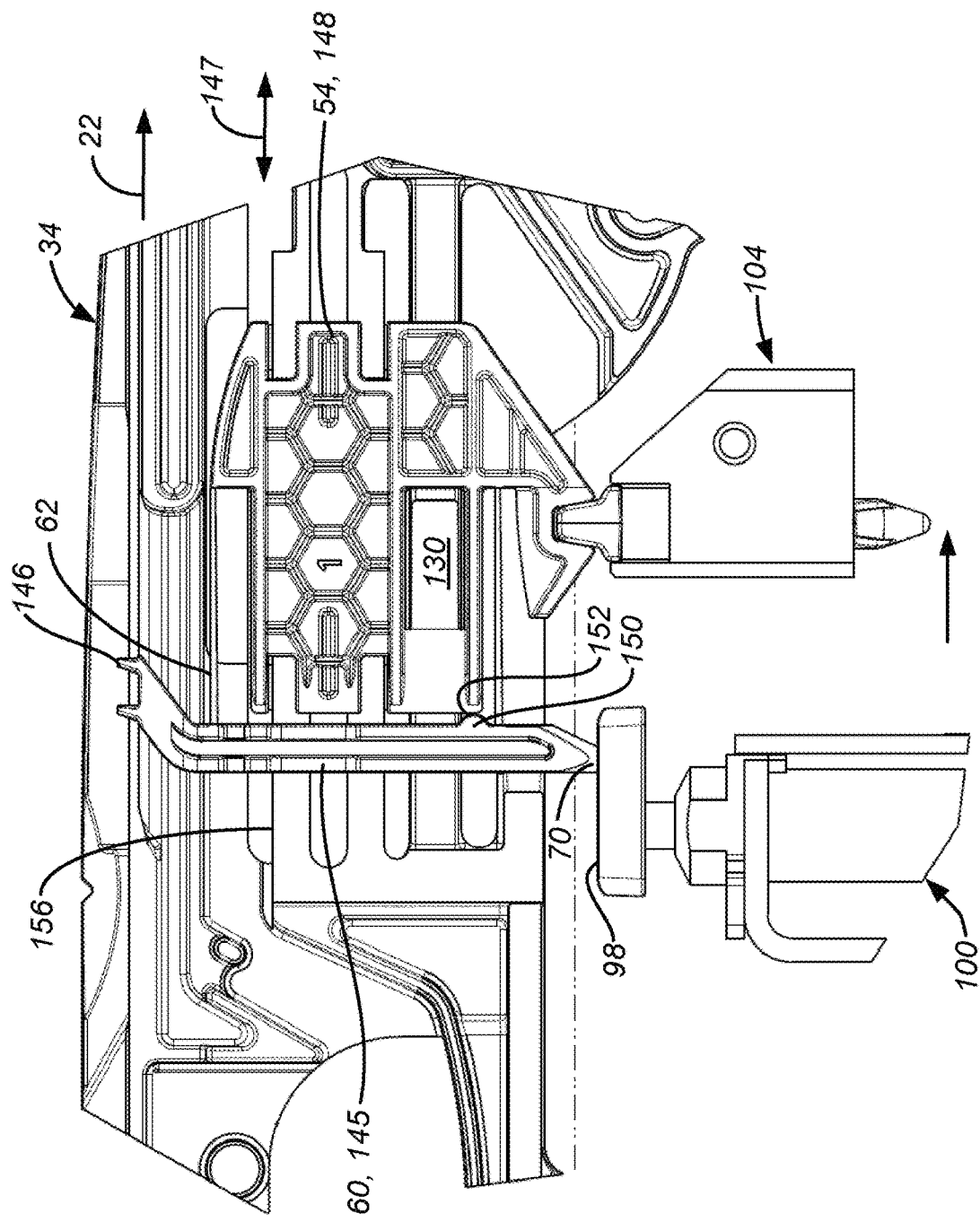
FIG. 10 shows the structure of FIG. 9 after the y-axis driving unit has moved horizontally to the right causing the feeder wagon body to be moved along a first pass parallel to the tape guide path to a second, delivery position, with the z-axis driving unit moving with the feeder wagon body while maintaining its first, tape engaged position as the lower end of the feeder head slides along an upper surface of the z-axis driving unit.

FIG. 10 shows the structure of FIG. 9 after y-axis driving unit 104 has moved horizontally to the right causing the feeder wagon body 54, and feeder head 60 connected thereto, to be moved along a generally horizontal, first path 147 generally parallel to tape guide path 22. This places feeder wagon body 54 at a second, delivery position 148. The pulling of feeder head 60 in the forward direction tends to create a buckling force on lower springs 64. To prevent spring 64 from buckling, feeder head 60 has a protrusion 150 which engages an edge 152 of feeder wagon body 54. During the movement of y-axis drive unit 104, drive surface 98 of z-axis driving unit 100 maintains its tape-engaged position 145 as the second driven interface 70 of feeder head 60 slides along drive surface 98.

FIG. 11 shows the structure of FIG. 10 after the drive surface 98 of z-axis driving unit 100 has been lowered causing feeder head 60 to move downwardly along the generally vertical, second path 144 under the influence of upper and lower springs 62, 64 to the tape released position 142. Z-axis driving unit 104 is maintained in the delivery position 148 of FIG. 10. While interface 70 and drive surface 98 are shown to in contact in FIG. 11, in practice as the solenoid type z-axis drive unit 100 moves downwardly and releases feeder head 60, drive surface 98 may be far enough down so that spring 62, 64 could move downwardly past their relaxed positions causing feeder head 60 to rebound and possibly allowing the feeding pins 146 to hit the bottom side of component tape 10. To prevent this, feeder head 60 and left side 34 have anti-bounce engagement surfaces created by an end stop 154 on feeder head 60, see FIGS. 6 and 7, which engages a horizontal surface 156 of left side 34, see FIGS. 10 and 11. This is followed by the movement of y-axis driving unit 104 to the left causing the second driven interface 72 to slide along a surface 98 until the structures return to positions 140 and 142 of FIG. 8 so that a new cycle can be started.

The above descriptions may have used terms such as above, below, top, bottom, over, under, et cetera. These terms may be used in the description and claims to aid understanding of the invention and not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. For example, in some examples the horizontal and vertical driving unit can be components of tape feeder 32. In some examples a combination horizontal, y-axis and vertical, z-axis driving unit could be used to engage feeder wagon 30 at a single position. Feeder head 60 could be slidably the feeder wagon body with an appropriate spring used to bias the feeder head against the surface 98. While feeder wagon 30 is shown, in this example, on left side 34 of tape feeder body 35, in other examples it could be mounted to right side 36 according to the configuration of compartment tape 10. Right side 36 could be replaced in some examples by nothing more than structure defining right tape guide groove 52. While the movement of feeder head 60 and feeder wagon body 54 through the actuation of the z-axis driving unit 100 and y-axis driving unit 104 are described as sequential, in practice, there could be some overlap of the movements. For example, after the z-axis drive unit 100 has moved the feeder head 60 downwardly a sufficient distance so that feeding pins 146 no longer engage carrier tape 14, y-axis driving unit 104 could begin its movement to the left towards the position of FIG. 9.

Any and all patents, patent applications and printed publications referred to above are incorporated by reference.

What is claimed:

1. A method, for use with a component mounting machine including an electronic component pickup head at a component pick position, for directing component tape to the component pick position, the component tape including a carrier tape with compartments containing circuit board components, the method comprising:
   positioning a length of component tape along a tape guide path of a tape feeder body of a tape feeder, the tape feeder further comprising a feeder wagon, the feeder wagon comprising a feeder wagon body and a feeder head;
   moving the feeder head along a feeder head path transverse to the tape guide path from a tape-released position in a relaxed state of a bias spring, against spring force resulting from moving the bias spring from its relaxed state to a tape-engaged position at which the feeder head drivingly engages the component tape;
   moving the feeder wagon body, and the feeder head therewith, along a linear path generally parallel to the tape guide path from a first feeder wagon position to a second feeder wagon position thereby causing the feeder head, engaging the component tape, to move a compartment of the carrier tape to the component pick position;
   moving the feeder head along a reverse feeder head path from the tape-engaged position to the tape-released position thereby disengaging the feeder head from the carrier tape; and
   moving the feeder wagon body, and the feeder head therewith, from the second feeder wagon position to the first feeder wagon position.

2. The method according to claim 1, wherein the component tape positioning step comprises guiding the length of component tape between opposed grooves formed in the tape feeder body.

3. The method according to claim 1, further comprising selecting a one-piece molded feeder wagon.

4. The method according to claim 1, wherein the feeder head moving steps are carried out with the feeder head path and the reversed feeder head path being straight paths, each generally perpendicular to the tape guide path.

5. The method according to claim 1, wherein each of the moving steps is completed before another moving step begins.

6. A method, for use with a component mounting machine including an electronic component pickup head at a component pick position, for directing component tape to the component pick position, the component tape including a carrier tape with compartments containing circuit board components, the method comprising:
   positioning a length of component tape along a tape guide path of a tape feeder body of a tape feeder, the tape feeder further comprising a feeder wagon, the feeder wagon comprising a feeder wagon body and a feeder head;
   moving the feeder head along a feeder head path transverse to the tape guide path from a tape-released position influenced by a bias spring, against spring force resulting from moving the feeder head to a tape-engaged position at which the feeder head drivingly engages the component tape;
   moving the feeder wagon body, and the feeder head therewith, along a linear path generally parallel to the tape guide path from a first feeder wagon position to a second feeder wagon position thereby causing the feeder head, engaging the component tape, to move a compartment of the carrier tape to the component pick position;
   moving the feeder head along a reverse feeder head path from the tape-engaged position to the tape-released position thereby disengaging the feeder head from the carrier tape; and
   moving the feeder wagon body, and the feeder head therewith, from the second feeder wagon position to the first feeder wagon position.

7. The method according to claim 6, wherein the component tape positioning step comprises guiding the length of component tape between opposed grooves formed in the tape feeder body.

8. The method according to claim 6, further comprising selecting a one-piece molded feeder wagon.

9. The method according to claim 6, wherein the feeder head moving steps are carried out with the feeder head path and the reversed feeder head path being straight paths, each generally perpendicular to the tape guide path.

10. The method according to claim 6, wherein each of the moving steps is completed before another moving step begins.

* * * * *